United States Patent [19]
Giordano et al.

[11] Patent Number: 4,978,868
[45] Date of Patent: Dec. 18, 1990

[54] SIMPLIFIED TRANSISTOR BASE CURRENT COMPENSATION CIRCUITRY

[75] Inventors: Raymond L. Giordano, Flemington; Salomon Vulih, Neshanic Station, both of N.J.

[73] Assignee: Harris Corporation, Melbourne, Fla.

[21] Appl. No.: 390,147

[22] Filed: Aug. 7, 1989

[51] Int. Cl.[5] .......................... H03K 3/01; H03K 3/26

[52] U.S. Cl. ............................. 307/296.600; 307/270; 323/316

[58] Field of Search ..................... 307/296.6, 443, 270, 307/296.1; 323/316

[56] References Cited

U.S. PATENT DOCUMENTS

| | | | |
|---|---|---|---|
| 4,263,519 | 4/1981 | Schade, Jr. | 307/296.6 |
| 4,446,419 | 5/1984 | van de Plassche et al. | 307/296.6 |
| 4,506,208 | 3/1985 | Nagano | 307/296.6 |
| 4,924,113 | 5/1990 | Schade, Jr. | 307/296.6 |

*Primary Examiner*—Stanley D. Miller
*Assistant Examiner*—Richard Roseen
*Attorney, Agent, or Firm*—Henry I. Schanzer

[57] ABSTRACT

The accuracy of a bandgap reference voltage generator that contains two n-p-n transistors, an operational amplifier and five resistors, is increased by the use of current compensation circuitry which includes a third n-p-n transistor with an emitter resistor and a current mirror circuit. A master leg of the current mirror circuit generates a first output current which is identical to base current needed by the two transistors of the bandgap voltage generator. A slave leg of the current mirror circuit generates a second output current which is identical to the first output current and which is coupled to bases of the two transistors of the bandgap reference voltage generator. Thus base current needed by the two transistors is supplied by the compensation circuitry. This improves the accuracy of the output voltage generated by the reference voltage bandgap generator.

31 Claims, 2 Drawing Sheets

SIMPLIFIED TRANSISTOR BASE CURRENT COMPENSATION CIRCUITRY

FIELD OF THE INVENTION

This invention relates to means for compensating for the load current drawn from a source in order to limit loading of the source and, in particular, to means for effectively cancelling the loading effects of bipolar transistors of a voltage reference circuit so as to increase its accuracy.

BACKGROUND OF THE INVENTION

U.S. Pat. No. 4,263,519 (Otto A. Schade, Jr.), assigned to the assignee of the present patent application, shows various bandgap voltage reference circuits. FIG. 5 of the U.S. Pat. No. 4,263,519 is reproduced herein and denoted as FIG. 1. A bandgap voltage ($E_{BG}$), which is relatively accurate, is generated between terminals 69 and 30. If resistor 61 is equal to resistor 62, then a reference voltage ($E_{REF}$) which is equal to 2 $E_{BG}$is generated at output terminal 70. The operation of the circuit of FIG. 1 is well known and its description in U.S. Pat. No. 4,263,519 is incorporated herein by reference. One limiting factor on the accuracy of the circuit of FIG. 1 is that base current is drawn from node 69 to drive transistors 31 and 32. This base current, even through it is typically only a small fraction of the current flow through resistor 61, limits the accuracy of the voltage generated at output terminal 70. Some applications require greater accuracy than can be achieved by the circuitry of U.S. Pat. No. 4,263,519.

U.S. patent application Ser. No. 07/220,712 (Otto A. Schade, Jr.), filed July 18, 1988, and assigned to the assignee of the present application, is directed to current compensation circuitry for use with a junction transistor bandgap voltage reference circuit. FIGS. 2, 3 and 4 herein are very similar to FIGS. 2, 3 and 4 of the above cited patent application. FIG. 2 shows a reference voltage generator circuit with current compensation 100 comprising a reference voltage generator 102 and current compensation circuitry 104. The reference numbers used for the components and terminals of circuitry 102 are the same as those used for the corresponding components and terminals of the circuitry shown in FIG. 1 with a "0" added there after. Reference voltage generator 102 is the same as the prior art reference voltage circuitry shown in FIG. 1 herein except for the addition of a bipolar n-p-n transistor 22 which has its base coupled to the output of the operational amplifier 330 and to a terminal 106, its emitter coupled to a terminal 700 and its collector coupled to a terminal 200. Transistor 22 acts as a buffer between operational amplifier 330 and resistor 610. One limitation of the accuracy of reference voltage generator 102 is that base current needed to bias n-p-n transistors 310 and 320 is drawn from resistor 610 via node (terminal) 690. Consequently, the current through resistor 610 is not identical to the current through resistor 620. Thus if resistor 610 is equal to resistor 620, the voltage generated at node 700 is not equal to twice the voltage generated at node 690. Furthermore, the base current for transistors 310 and 320 varies with the current gains (betas) of the transistors and with temperature. Current compensation circuitry 104 generates a compensating current which flows into node 690 and which is essentially identical to the base current which flows from node 690 into the bases of transistors 310 and 320. The base current normally drawn from node 690 by the bases of transistors 310 and 320 is replaced by current compensation circuitry 104 and thus essentially the same current flow through resistors 610 and 620. The accuracy of the output voltage $E_{REFO}$ appearing at terminal 700 relative to the bandgap voltage $V_{BG}$ appearing at node 690 of reference generator circuitry 102 is therefore improved, typically by an order of magnitude or better.

Current compensation circuitry 104 comprises a two input operational amplifier 112, a current mirror circuit 118, an n-p-n transistor 120 and a resistor 124. Transistor 120 and resistor 124 may be denoted as a load element or as a dummy load element. Node 690 is coupled to a positive input terminal of operational amplifier 112 and to a second (slave) output terminal of current mirror circuit 118. A negative input terminal of operational amplifier 112 is coupled to node 116 to which is connected a first (master) output terminal of current mirror circuit 118 and the base of transistor 120. An output terminal of operational amplifier 112 is coupled to node 114 to which is connected an input terminal (generally denoted in the art as a common terminal) of current mirror circuit 118. The emitter of transistor 120 is coupled to node 122 to which is coupled a first terminal of resistor 124. The collector of transistor 120 is coupled to a terminal 200 to which is applied a positive voltage+VO. A second terminal of resistor 124 is coupled to a terminal 300 to which is applied a reference voltage which is shown as ground.

The operational amplifier 112 and the current mirror circuit 118 cause the potential of node 116 to be essentially the same as the potential ($V_{BG}$) of node 690. Transistor 120 is designed to be the equivalent of transistors 310 and 320 and resistor 124 is designed to be equal to the equivalent of resistors 340, 360 and 350. If the same power supplies and base voltages are applied to transistors 310, 320 and 120, then the same total current that flows into the bases of transistors 310 and 320 is equal to the current flowing into the base of transistor 120 (node 116). Thus the current flow from node 690 into the bases of transistors 310 and 320 is supplied into node 690 by current mirror 118. Accordingly, circuitry 104 supplies all of the base current for transistors 310 and 320 and thus all the current which flows through resistor 610 also flows through resistor 620. This improves the accuracy of the voltage $E_{REFO}$ appearing at the output terminal 700 of reference voltage generator 102 by typically an order of magnitude or better.

FIG. 3 shows current compensation circuitry 104 with circuitry of operational amplifier 112 shown within a dashed line rectangle 112*a* and circuitry of the current mirror circuit 118 shown within a dashed line rectangle 118*a*.

Operational amplifier 112 comprises Field Effect Transistors (FETs) 124, 126, 128 and 130, an n-p-n bipolar transistor 132 and a resistor 138. Current mirror circuit 118 comprises FETs 134 and 136. FETs 124 and 126 are both n-channel Metal-Oxide-Silicon (MOS) FETs and FETs 128, 130, 134 and 136 are all p-channel MOS FETs. The gate of transistor 124 is coupled to the drain of FET 136 and to node 690. The sources of transistors 124 and 126 are coupled to a first terminal of resistor 138 and to a node 144. Second terminals of resistors 138 and 124 are coupled to terminal 300 and to ground potential. The sources of transistors 128 and 130 and the collectors of transistors 120 and 132 are coupled together to terminal 200 and to. positive voltage +VO. The drain of transistor 124 is coupled to the gates of transistors 128 and 130, to the drain of transistor 128 and to a node 140. The drain of transistor 126 is coupled to the drain of transistor 130, to the base of transistor 132 and to a node 142. The emitter of transistor 132 is coupled to the sources of transistors 134 and 136 and to node 114. The gates of transistors 126, 134 and 136 are coupled to the drain of transistor 134, to the base of transistor 120 and to node 116. The emitter of transistor 120 is coupled to one terminal of resistor 124 and to a node 122.

Transistors 134 and 136 serve as the master and slave legs, respectively, of the current mirror 118. The current that flows through transistor 134 is duplicated and flows through transistor 136. Thus the current that flows into the base of transistor 120 is essentially the same as flows into node 690 from transistor 136. The gates of transistors 124 and 126 draw essentially no current out of nodes 690 and 116, respectively, since the input impedances of transistors 124 and 126 is high as they are both FETs. Transistor 120 and resistor 124 are the equivalent of transistors 310 and 320 and resistors 340, 360 and 350. Furthermore, the supply voltages,- +VO and ground, used for power are identical. Hence, the current flowing into the base of transistor 120 is essentially equal to the sum of the currents flowing into the bases of transistors 310 and 320. In view of this it is clear that the current needed to bias transistors 310 and 320 is supplied by compensation circuitry 104. Thus the current which flows through resistor 610 is the same as flows through resistor 620 and accordingly the accuracy of voltage generator circuitry 102 is improved.

However, operational amplifier 112 increases the complexity and the manufacturing cost of compensation circuitry 104. In many applications it is thus desirable to have circuitry which provides compensating base drive for a bandgap voltage reference circuit, but which uses fewer components and is simple to manufacture.

SUMMARY OF THE INVENTION

The present invention is directed to current compensation circuitry which is connectible to a voltage generator (e.g., the previously discussed bandgap reference voltage generator) which comprises at least one bipolar transistor whose base drive current requirements limit the accuracy of a generated reference voltage. The compensation circuitry of the present invention is adapted to supply the needed base current and thus improves the accuracy of the generated reference voltage while having a simple structure with few components.

In one embodiment the compensation circuitry of the present invention comprises a current mirror circuit, a second bipolar transistor having a base and first and second outputs and a first resistor. The current mirror circuit has an input which is adapted to be coupled to a reference voltage output terminal of the voltage reference generator circuit, has a first output which is adapted to be coupled to the base of the first bipolar transistor of the voltage reference generator circuit, and has a second output which is coupled to the base of the second transistor. The first output of the second transistor is coupled to a first terminal of the first resistor.

In a preferred embodiment of the invention the current mirror comprises slave and master legs formed from bipolar components. The first and second outputs of the current mirror circuit are coupled to the slave and master legs, respectively. The beta (current gain) and emitter-base voltage characteristic of the second bipolar transistor are selected to be the equivalent of a composite of the emitter-base voltage characteristic and beta of the first bipolar transistor. The resistance of the first resistor is selected such that during operation of the voltage reference circuit and the compensating current circuitry the current which flows through the second transistor is essentially equal to the current which flows through the first transistor.

Viewed from another aspect, the present invention is directed to circuitry which is coupled to first and second terminals of a voltage reference generator circuit which includes a first bipolar transistor having a base coupled to the first terminal at which a voltage $V_{BG}$ is generated and which generates a voltage $V_{REFO}$ at the second terminal with $V_{REFO}$ equal to $K(V_{BG})$, where K is a positive integer greater than one. The circuitry comprises a current mirror and first and second means. The current mirror has a master output and a slave output with the slave output coupled to the first terminal of the voltage reference generator. The first means comprises a second bipolar transistor having an emitter thereof coupled to a resistor and having a base. The second means has an input coupled to the master output of the current mirror and has an output coupled to the base of the second transistor and comprises K-2 pn diodes serially connected together between the input and output of the second means with the input and output of the second means being essentially directly connected together without any diodes therebetween when K equals 2.

The invention will be better understood from the following detailed description taken in connection the accompanying drawings.

DETAILED DESCRIPTION

Figure 1:
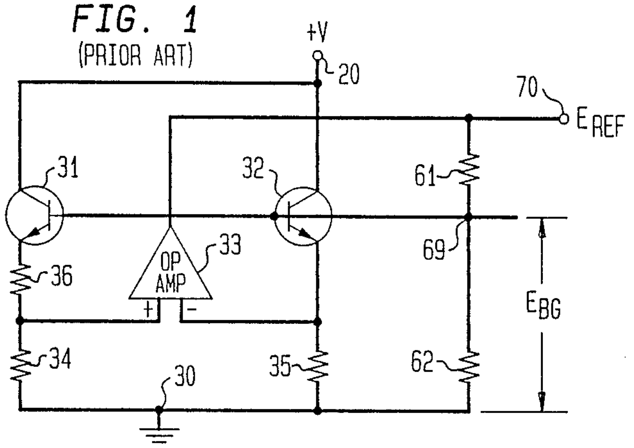
FIG. 1 (PRIOR ART)
FIG. 1 shows a schematic of a prior art reference voltage generator which has been previously discussed herein.
Figure 2:
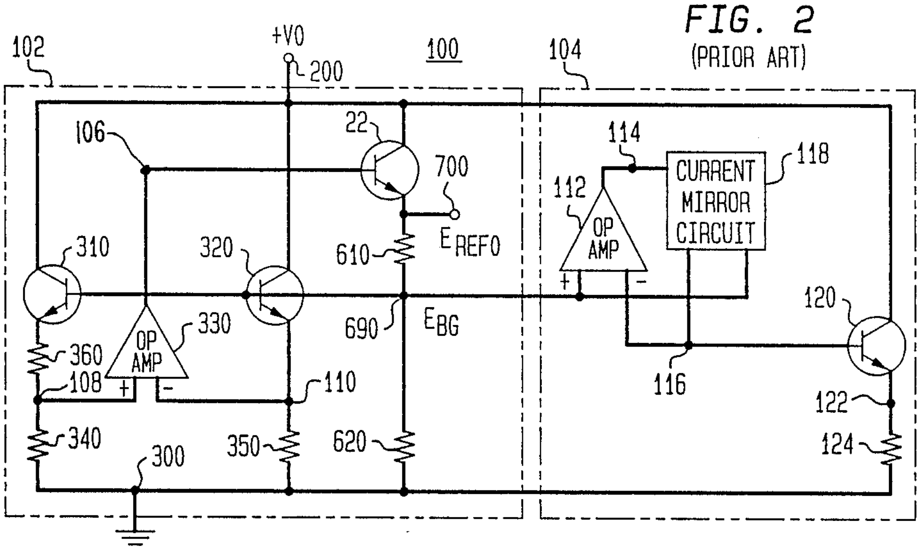
FIG. 2 (PRIOR ART)
FIG. 2 shows a prior art reference voltage generator with current compensation circuitry which has been previously discussed herein.
Figure 3:
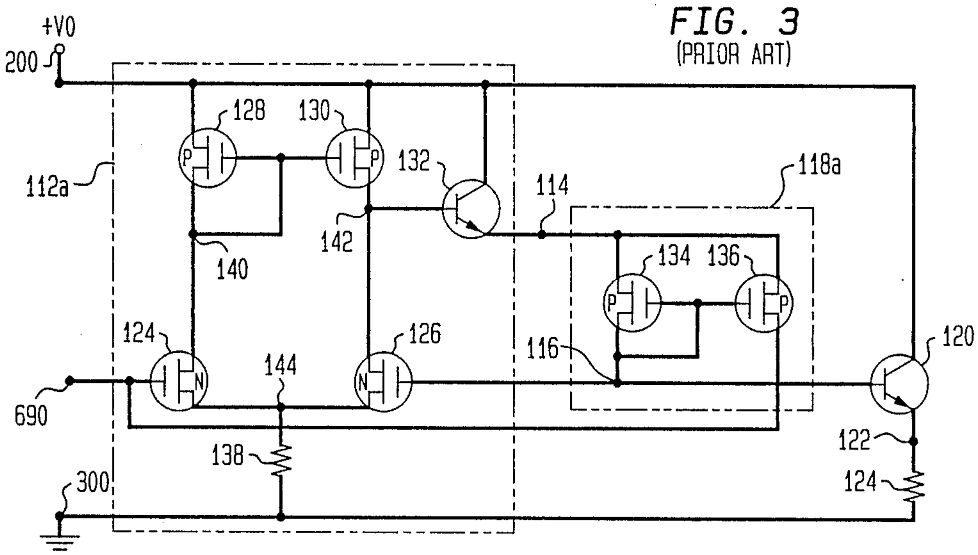
FIG. 3 (PRIOR ART)
FIG. 3 shows a prior art preferred embodiment of the ,,,,, current compensation circuitry of FIG. 2 which has been. previously discussed herein.
Figure 4:
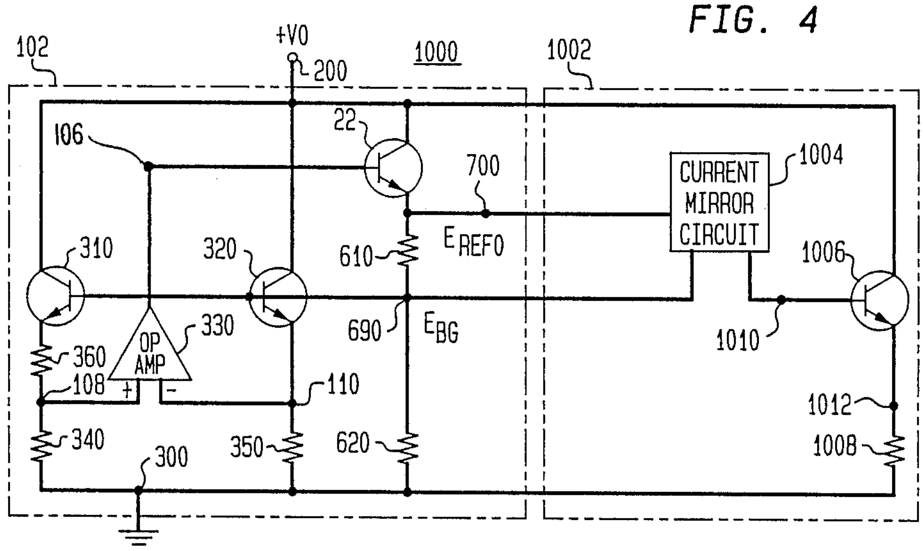
FIG. 4 shows a reference voltage generator with current compensation circuitry in accordance with the present invention.

Referring now to FIG. 4, there is shown a reference voltage generator circuit with current compensation circuitry 1000 comprising within a first dashed line rectangle the reference voltage generator 102 of FIG. 2 and within a second dashed line rectangle current compensation circuitry 1002 in accordance with the present invention. One limitation of the accuracy of reference voltage generator 102 is that base current needed to bias n-p-n transistors 310 and 320 is drawn from resistor 610 via node (terminal) 690. Transistors 310 and 320 are shown as separate transistors having their collectors coupled together and having their bases coupled together. This is done to simplify the explanation of the operation of reference voltage generator 102. In a preferred embodiment transistors 310 and 320 are implemented as a single transistor having a single collector and a single base within which is formed at least two separate emitters. The base current for transistors 310 and 320 varies with the betas of the transistors and with temperature. As will become clear from the following description, current compensation circuitry 1002 generates a current which flows into node 690. This current is essentially identical to the base current which flows from node 690 into the bases of transistors 310 and 320 when circuitry 1002 is not used. The base current into transistors 310 and 320, which is normally drawn into node 690 from resistor 610, is replaced by current compensation circuitry 1002 and thus essentially the same current flows through resistors 610 and 620. This improves the accuracy of the output voltage $E_{REFO}$ appearing at terminal 700 of reference generator circuitry 102 by typically an order of magnitude or better. One substantial advantage of current compensation circuitry 1002, as compared to current compensation 104 of FIG. 2, is that it comprises fewer components and therefore facilitates lower manufacturing costs.

Compensation circuitry 1002 comprises a current mirror circuit 1004, an n-p-n transistor 1006 and a resistor 1008. Transistor 1006 and resistor 1008 may be denoted as a first means. An input terminal (typically denoted as a common terminal) of current mirror circuit 1004 is coupled to output terminal 700 (the terminal at which the reference voltage $E_{REFO}$ is generated) of voltage generator circuit 102. A first (slave) output terminal of the current mirror 1004 is coupled to terminal 690 (the output terminal at which a bandgap voltage is generated) of voltage generator 102. A second (master) output terminal of current mirror circuit 1002 is coupled to the base of transistor 1006 at terminal 1010. The collector of transistor 1006 is coupled to the terminal 200 to which is applied a positive voltage source+VO. The emitter of transistor 1006 is coupled to a first terminal of resistor 1008 at a terminal 1012. A second terminal of resistor 1008 is coupled to terminal 300 to which is applied a reference voltage which is shown as ground potential (zero volts).

Figure 5:
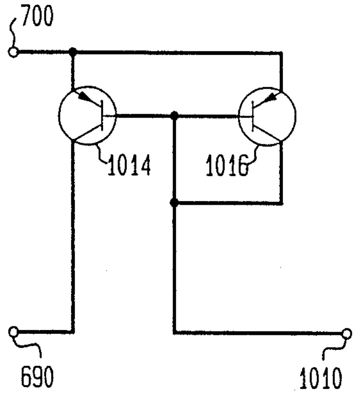
FIG. 5 shows an embodiment of a portion of the current compensation circuitry of FIG. 4.

Referring now to FIG. 5, there is shown another embodiment of a current mirror circuit 1004 suitable for use when the resistances of resistors 610 and 620 are essentially equal. In this case $E_{REFO}$ (the voltage generated at terminal 700) equals twice the bandgap voltage (the voltage generated at terminal 690). Current mirror circuit 1004 of this illustrative embodiment comprises p-n-p transistors 1014 and 1016. Transistors 1014 and 1016 comprise a slave leg and a master leg, respectively, of current mirror circuit 1004. The emitters of transistors 1014 and 1016 are coupled together to terminal 700. The collector of transistor 1014 is coupled to the terminal 690, and the collector and base of transistor 1016 are connected to the bases of transistors 1006 and 1014 and to the terminal 1010. The collector and base of transistor 1016 are connected together such that transistor 1016 acts as a diode with the emitter serving as the anode and the base and collector serving as the cathode.

With the beta and emitter-base voltage characteristic of transistor 1006 selected to be the equivalent of a composite of the corresponding characteristics of transistors 310 and 320, the below equations illustrate how to select a resistance value for resistor 1008 such that current mirrored into terminal 690 is exactly that current which is needed as base drive current for transistors 310 and 320.

The current ($I_{R350}$) flowing through resistor 350 is given by the below equation.

$$I_{R350}=(V_{BG}-V_{BE\ T320})/R_{350},$$

where $V_{BG}$ is the bandgap voltage appearing at terminal 690, $V_{BE\ T320}$ is the emitter-base voltage of transistor 320 and $R_{350}$ is the value of resistor 350.

The current ($I_{R340}$) flowing through resistor 340 is given by the below equation.

$$I_{R340}=(V_{BG}-V_{BE\ T320})/R_{340},$$

where $V_{BG}$ is the bandgap voltage appearing at terminal 690 which is also denoted as $V_{690}$, $V_{BE\ T320}$ is the emitter base voltage of transistor 320 and $R_{340}$ is the value of resistor 340. This is valid since operational amplifier 330 causes terminals 108 and 110 to be at essentially the same voltage.

The total current ($I_T$) flowing through and 350 is given by the below equation.

$$I_T=I_{R350}+I_{R340}=(V_{BG}-V_{BE\ T320})/R_{350}+(V_{BG}-V_{BE\ T320})/R_{340}==(V_{BG}-V_{BE\ T320})[(R_{340}+R350)/(R340)(R350)], \quad \text{Eq. 1}$$

The current ($I_{R1008}$) flowing through resistor 1008 is given by the below equation.

$$I_{R1008}=(E_{REFO}-V_{BE\ T1016}-V_{BE\ T1006})/R1008,$$

where $E_{REFO}=V_{BG}$ (1 +R610/R620) which is the voltage at terminal 700, $V_{BE\ T1016}$ is the emitter-base voltage of transistor 1016, $V_{BE\ T1006}$ is the emitter-base voltage of transistor 1006 and R1008 is the resistance of resistor 1008.

If $V_{BE\ T1016}$ is approximately equal to $V_{BE\ T1006}$, then, $$I_{R1008}=[V_{BG}(1+R610/R620)-2V_{BE}]/R1008,$$

where $V_{BE}=V_{BE\ T1006}=V_{BE\ T1016}$.

In the case in which R620=R610, $E_{REFO}=V_{BG}$(1+R620/R610)$=2V_{BG}$ and the current equation for current flow through resistor 1008 becomes:

$$I_{R1008}=(2-V_{BE}-2V_{BE})/R1008=2(V_{BG}--V_{BE})/R1008 \quad \textbf{Eq. 2}$$

Equating equations Eq. 1 and Eq. 2 results in:

$$V_{BG}VBE)[(R_{340}+R350)/(R_{340})(R350)=2(V_{BG}-V_{BE})/R1008$$

Simplifying this equation results in:

$$(R_{340}+R350)/(R_{340})(R350)=2/R1008$$

Further simplification of the equation results in:

$$R1008=2\ [(R340)(R350)/(R340+R350)]$$

Accordingly, by making the resistance of resistor 1008 twice that of the parallel combination of resistors 340 and 350, the $V_{BG}$ and the $V_{BE}$ terms drop out of the equation. This which makes the current compensation circuitry 1002 independent of these parameters that vary with processing and temperature changes. Thus with resistor 610 having the same resistance as resistor 620, if the resistance of resistor 1008 is chosen to be twice that of the resistance of a parallel combination of resistors 340 and 350, current compensation circuitry 1002 provides, via the first (slave) output terminal of current mirror circuit 1004, all of the base drive current needed by transistors 310 and 320, independent of temperature and process variations. This improves the accuracy of the reference voltage generator circuit 102.

A reference voltage generator circuit with current compensation 1000 was built with resistors 610 and 620 being of equal resistance using the reference voltage generator 102 of FIG. 4, modified to include the circuit 1026, and the current compensation circuitry 1002 having the current mirror circuit 1004 of FIG. 5. The bandgap $E_{BG}$ and $E_{REFO}$ voltages generated were 1.25 volts and 2.5 volts, respectively.

Figure 6:
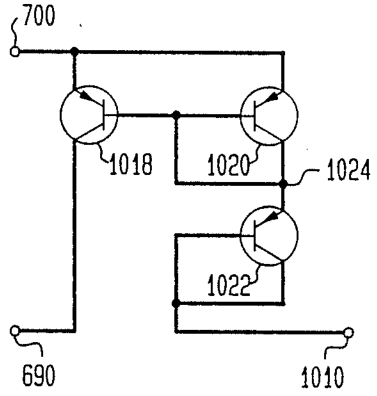
FIG. 6 shows another embodiment of a portion of the current compensation circuitry of FIG. 4.

Referring now to FIG. 6, there is shown another embodiment of the current mirror circuit 1004 suitable for use where resistor 610 has essentially twice the resistance of resistor 620. With this ratio of resistances the voltage $E_{REFO}$ is three times that of the bandgap voltage generated at terminal 690. The value of resistance of resistor 1008 is selected to be three times the parallel resistance of resistors 340 and 350. Current mirror circuit 1004 of this embodiment comprises p-n-p transistors 1018, 1020 and 1022. Transistor 1018 comprises a slave leg of current mirror circuit 1004 and transistors 1020 and 1022 comprise a master leg of current mirror circuit 1004. Terminals 690 and 1010 may be denoted as the slave and master outputs, respectively of current mirror 1004. Transistor 1022 may be denoted as a second means. The emitters of transistors 1018 and 1020 are coupled together to terminal 700. The collector of transistor 1018 is coupled to terminal 690, and the collector and base of transistor 1022 are coupled to terminal 1010. The collector and base of transistor 1020 are coupled to the emitter of transistor 1022, to the base of transistor 1018 and to a terminal 1024. Transistors 1020 and 1022 both serve as diodes with the emitter of each serVing as an anode and the base and collector of each serving as a cathode. A pn diode can be substituted for transistor 1022.

If the $E_{REFO}$ voltage is four times that of the $V_{BG}$ voltage then an additional diode, like transistor (diode) 1022, is added in series with the base and collector of transistor 1022 and the base (terminal 1010) of transistor 1006. In this case the resistance of resistor 610 is three times the resistance of resistor 620 and the resistance of resistor 1008 is selected to be four times the parallel resistance of resistors 340 and 350. For each addition multiple that $E_{REFO}$ is greater than $V_{BG}$, an additional diode (e.g., a transistor with its base and collector coupled together) is added in series with the other diodes (transistors). In the general case $E_{REFO}=K(V_{BG})$, where K is a number greater than 1, the number of diodes which form part of the current mirror, other than the one required, is equal to K-2. The case where K=2 is shown in FIG. 5 and the case where K=3 is shown in FIG. 6. If $E_{REFO}$ is not an - even multiple of $V_{BG}$, then current compensation circuitry 1002 can be set so as to provide substantial, but not all of the needed base current. In this case there is considerable improvement in the accuracy of output voltages of voltage reference generator circuit 102, but there may be some variation in output voltage with temperature and process changes.

Figure 7:
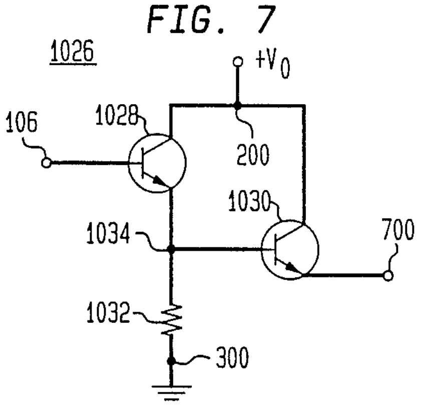
FIG. 7 shows a preferred embodiment of a portion of the reference voltage generator of FIG. 4.

Referring now to FIG. 7, there is shown a circuit 1026 which comprises transistors 1028 and 1030 and a resistor 1032. Transistors 1028 and 1030 form a Darlington Pair which can be substituted for transistor 22 of FIG. 4 and is the preferred embodiment. The base of transistor 1028 is coupled to terminal 106. The collectors of transistors 1028 and 1030 are coupled to terminal 200 and to +VO. The emitter of transistor 1028 is coupled to the base of transistor 1030, to a first terminal of resistor 1032 and to a terminal 1034. A second terminal of resistor 1032 is coupled to terminal 300 and to a reference voltage which is shown as ground potential (zero volts). The emitter of transistor 1030 is coupled to terminal 700. Circuit 1026 is the preferred embodiment because it provides higher input impedance and gain than transistor 22.

It is to be understood that the embodiments described herein are merely illustrative of the principles of the invention. Various modifications are possible within the scope of the invention.

What is claimed is:

1. Circuitry coupled to a voltage reference generator circuit having a reference voltage output terminal and including a first bipolar transistor having a base, said circuitry comprising:

a current mirror circuit having an input and first and second outputs;

a second bipolar transistor being of the same conductivity type as the first transistor and having a base and a first output;

the input of the current mirror circuit coupled to the reference voltage output terminal of the voltage reference generator circuit;

the first output of the current mirror circuit being coupled to the base of the first transistor;

the second output of the current mirror circuit being coupled to the base of the second transistor; and a first resistor having a first terminal coupled to the first output of the second transistor.

2. The compensating current generator circuitry of claim 1 wherein the resistance of the first resistor is selected such that during operation of the voltage reference circuit and the circuitry the current which flows through the second transistor is essentially equal to the sum of the currents which flow through the first transistor.

3. The compensating current generator circuitry of claim 2 wherein the current mirror comprises:

third and fourth bipolar transistors each having a base and first and second outputs;

the first output of the third transistor being coupled to the base of the first transistor;

the second outputs of the third and fourth transistors being coupled to the reference voltage output terminal; and the base of the third transistor and the base and first output of the fourth transistor being coupled to the base of the second transistor.

4. The compensating current generator circuitry of claim 3 wherein the first and second transistors are n-p-n transistors and the third and fourth transistors are p-n-p transistors and each of the transistors has a base, an emitter and a collector.

5. The compensating current generator circuitry of claim 4 wherein:

the collectors of the first and second transistors are coupled together; and the emitters of the third and fourth transistors are coupled together and are adapted to be coupled to the reference voltage output terminal.

6. Circuitry adapted to be coupled to a reference voltage output terminal and to bases of first and second bipolar transistors of a voltage reference generator circuit, said circuitry comprising:

a current mirror circuit having an input and first and second outputs;

a third bipolar transistor being of the same conductivity type as the first and second transistors and having a base and first and second outputs;

the input of the current mirror circuit being coupled to the reference voltage output terminal of the voltage reference generator circuit;

the first output of the current mirror circuit being coupled to the bases of the first and second transistors;

the second output of the current mirror circuit being coupled to the base of the third transistor; and a first resistor having a first terminal coupled to the first output of the third transistor.

7. The compensating current generator circuitry of claim 6 wherein the resistance of the first resistor is selected such that during operation of the voltage reference circuit and the circuitry the current which flows through the third transistor is essentially equal to the sum of the currents which flow through the first and second transistors.

8. The compensating current generator circuitry of claim 7 wherein the current mirror comprises:

fourth and fifth bipolar transistors each having a base and first and second outputs;

the first output of the fourth transistor being coupled to the bases of the first and second transistors;

10 the second outputs of the fourth and fifth transistors being coupled to the reference voltage output terminal; and the base of the fourth transistor and the base and first output of the fifth transistor being coupled to the base of the third transistor.

9. The compensating current generator circuitry of claim 8 wherein the first, second and third transistors are n-p-n transistors and the fourth and fifth transistors are p-n-p transistors and each of the transistors has a base, an emitter and a collector.

10. The compensating current generator circuitry of claim 9 wherein:

the collectors of the first, second and third transistors are coupled together; and the emitters of the fourth and fifth transistors are coupled together and are coupled to the reference voltage output terminal.

11. The compensating current generator circuitry of claim 10 wherein:

the voltage generator circuit comprises second, third, fourth, fifth and sixth resistors each having first and second terminals and further comprises a sixth n-p-n . bipolar transistor having a base coupled to an output of an amplifier, having an emitter coupled to the first terminal of the second resistor, and having a collector coupled to the collectors of the first, second and third transistors;

the second terminal of the second resistor being coupled to the first terminal of the third resistor and to the bases of the first and second transistors;

the first terminal of the fourth resistor being coupled to the emitter of the first transistor and to a first input of the amplifier:

the first terminal of the fifth resistor being coupled to the emitter of the second transistor; and the second terminal of the fifth resistor being coupled to the first terminal of the sixth resistor and to a second input of the amplifier.

12. The compensating current generator circuitry of claim 11 wherein the amplifier of the voltage generator circuit is an operational amplifier.

13. The compensating current generator circuitry of claim 12 wherein the voltage generator circuit and the compensating current generator circuitry are formed on a common integrated circuit chip.

14. The compensating current generator circuitry of claim 13 wherein the integrated circuit chip is of silicon.

15. Compensating current generator circuitry, which is connectable to a voltage generator circuit which includes first and second bipolar transistors of the same conductivity type with each having a base and first and second outputs, and further includes an amplifier and first and second resistors with first terminals of the first and second resistors being coupled to the bases of the first and second transistors and with a second terminal of the first resistor being coupled to an output of the amplifier, said compensating circuitry comprising:

a current mirror circuit having an input and first and second outputs;

a third bipolar transistor being of the same conductivity type as the first and second transistors and having a base and first and second outputs;

the input of the current mirror circuit being coupled to the second terminal of the first resistor;

the first output of the current mirror circuit being coupled to the bases of the first and second transistors;.

the second output of the current mirror circuit transistor; and a third resistor having a first terminal coupled to the first output of the third transistor.

16. The compensating current generator circuitry of claim 15 wherein the resistance of the third resistor being selected such that during operation of the voltage reference circuit and the compensating current circuitry the current which flows through the third transistor is essentially equal to the sum of the currents which flow through the first and second transistors.

17. The compensating current generator circuitry of claim 16 wherein the current mirror comprises:

fourth and fifth bipolar transistors each having a base and first and second outputs;

the first output of the fourth transistor being coupled to the bases of the first and second transistors;

the second outputs of the fourth and fifth transistors being coupled together to the second terminal of the first resistor; and the base of the fourth transistor and the base and first output of the fifth transistor being coupled to the base of the third transistor.

18. The compensating current generator circuitry of claim 17 wherein the first, second and third transistors are n-p-n transistors and the fourth and fifth transistors are p-n-p transistors and each of the transistors has a base, an emitter and a collector.

19. The compensating current generator circuitry of claim 18 wherein:

the collectors of the first second and third transistors are coupled together;

the emitters of the fourth and fifth transistors are coupled together and are coupled to the second terminal of the first resistor; and second terminals of the second and third resistors are coupled together.

20. The compensating current generator circuitry of claim 19 wherein:

the voltage generator circuit comprises fourth, fifth and sixth resistors each having first and second terminals and further comprises a sixth n-p-n junction transistor having a base coupled to an output of an amplifier, having an emitter coupled to a second terminal of the first resistor, and having a collector coupled to the collectors of the first, second and third transistors; and the first terminal of the fourth resistor being coupled to the emitter of the first transistor;

the first terminal of the fifth resistor being coupled to the emitter of the second transistor;

the second terminal of the fifth resistor being coupled to the first terminal of the sixth resistor;

the amplifier has a first input coupled to the emitter of the first transistor and has a second input coupled to the second terminal of the fifth resistor.

21. The compensating current generator circuitry of claim 20 wherein the amplifier of the voltage generator circuit is an operational amplifier.

22. The compensating current generator circuitry of claim 21 wherein the voltage generator circuit and the compensating current generator circuitry are formed on a common integrated circuit chip.

23. The compensating current generator circuitry of claim 22 wherein the integrated circuit chip is of silicon.

24. In combination:

a reference voltage generator comprising first and second n-p-n transistors, each transistor having a base, an emitter and a collector and first, second, third, fourth and fifth resistors and an operational amplifier having first and second inputs and an output;

the bases of the first and second transistors being coupled to first terminals of the first and second resistors;

the emitter of the first transistor being coupled to a first terminal of the third resistor and to the first input of the operational amplifier;

the emitter of the second transistor being coupled to a first terminal of the fourth resistor;

a second terminal of the fourth resistor being coupled to a first terminal of the fifth resistor and to the second input of the operational amplifier;

the output of the operational amplifier being coupled to a second terminal of the first resistor;

current compensation circuitry comprising a current mirror having an input and first and second outputs, a third n-p-n transistor, each transistor having a base, an emitter and a collector and a sixth resistor;

the second terminal of the first resistor being , coupled to the input of the current mirror;

the first output of the current mirror being coupled to the first terminal of the first resistor;

the second output of the current mirror being coupled to the base of the third transistor; and the emitter of the third transistor being coupled to a first terminal of the sixth resistor.

25. The combination of claim 24 wherein the resistance of the sixth resistor is selected such that during operation of the combination current which flows through the sixth resistor is essentially equal to the sum of currents which flow through the third and fifth resistors.

26. The combination of claim 25 wherein the current mirror comprises:

fourth and fifth p-n-p transistors each having a base, an emitter and a collector;

the collector of the fourth transistor being coupled to the bases of the first and second transistors;

the emitters of the fourth and fifth transistors being coupled together to the second terminal of the first resistor; and the base of the fourth transistor and the base and collector of the fifth transistor being coupled to the base of the third transistor.

27. The combination of claim 26 wherein the collectors of the first, second and third n-p-n transistors are coupled together and the second terminals of the third, fifth and sixth resistors are coupled together.

28. The combination of claim 27 wherein the second terminal of the second resistor is coupled to the second terminal of the third resistor.

29. The combination of claim 28 further comprising a sixth n-p-n transistor having an emitter, a base and a collector with the emitter thereof being coupled to a second terminal of the first resistor, the base thereof being coupled to the output of the first operational amplifier, and with the collector thereof being coupled to the collectors of the first, second and third transistors.

30. The combination of claim 29 wherein the reference voltage generator and the current compensation circuitry are both formed in a single integrated circuit chip.

31. Circuitry, which is coupled to first and second terminals of a voltage reference generator circuit which includes a first bipolar transistor having a base coupled to the first terminal at which a voltage $V_{BG}$ is generated and which generates a voltage $V_{REFO}$ at the second terminal with $V_{REFO}$ equal to $K(V_{BG})$, where K is a positive integer greater than one, said circuitry comprising:

a current mirror having a master output and a slave output with the slave output being coupled to the first terminal of the voltage reference generator circuit;

first means comprising a second bipolar transistor having an emitter thereof coupled to a resistor and having a base;

second means having an input coupled to the master output of the current mirror and having an output coupled to the base of the second transistor; and the second means comprises K-2 pn diodes serially connected together between the input and output of the second means with the input and output of the second means being essentially directly connected together without any diodes therebetween when K equals 2.

* * * * *